(12) United States Patent
Lin et al.

(10) Patent No.: US 10,256,028 B2
(45) Date of Patent: Apr. 9, 2019

(54) BUILDUP BOARD STRUCTURE

(71) Applicant: KINSUS INTERCONNECT TECHNOLOGY CORP., Taoyuan (TW)

(72) Inventors: Ting-Hao Lin, Taipei (TW); Chiao-Cheng Chang, Taoyuan (TW); Yi-Nong Lin, Keelung (TW)

(73) Assignee: KINSUS INTERCONNECT TECHNOLOGY CORP., Taoyuan (TW)

( * ) Notice: Subject to any disclaimer, the term of this patent is extended or adjusted under 35 U.S.C. 154(b) by 77 days.

(21) Appl. No.: 15/086,333

(22) Filed: Mar. 31, 2016

(65) Prior Publication Data
US 2017/0287617 A1  Oct. 5, 2017

(51) Int. Cl.
*H01F 27/28* (2006.01)
*H05K 1/03* (2006.01)
*H05K 1/11* (2006.01)
*H05K 1/16* (2006.01)
*H05K 3/46* (2006.01)

(52) U.S. Cl.
CPC ....... *H01F 27/2804* (2013.01); *H05K 1/0393* (2013.01); *H05K 1/113* (2013.01); *H05K 1/118* (2013.01); *H05K 1/165* (2013.01); *H05K 3/4617* (2013.01); *H05K 3/4644* (2013.01); *H01F 2027/2809* (2013.01)

(58) Field of Classification Search
CPC .................................. H01F 5/00; H01F 27/28
USPC .................................................. 336/200, 232
See application file for complete search history.

(56) References Cited

FOREIGN PATENT DOCUMENTS

| CN | 1201366 A | 12/1998 |
|----|-----------|---------|
| CN | 1292636 A | 4/2001 |
| JP | H01162309 A | 6/1989 |
| JP | 2003185986 A | 7/2003 |
| JP | 2007035980 A | 2/2007 |

OTHER PUBLICATIONS

Office Action issued in corresponding China patent application dated Sep. 19, 2018.

*Primary Examiner* — Tsz Chan
(74) *Attorney, Agent, or Firm* — Idea Intellectual Limited; Margaret A. Burke; Sam T. Yip

(57) ABSTRACT

A buildup board structure incorporating magnetic induction coils and flexible boards is disclosed. The buildup board structure includes at least one first, second and third buildup bodies modular and stackable. Any two adjacent buildup bodies are separated by a covering layer provided with a central hole for electrical insulation. All central holes are aligned. Each buildup body includes a plurality of flexible boards, and each flexible board is embedded with a plurality of magnetic induction coils surrounding the corresponding central hole and connected through connection pads. The first, second and third buildup bodies are easily laminated in any order by any number as desired such that the effect of magnetic induction provided by the magnetic induction coils embedded in the buildup board structure are addable to greatly enhance the overall effect of magnetic induction.

10 Claims, 4 Drawing Sheets

BUILDUP BOARD STRUCTURE

BACKGROUND OF THE INVENTION

1. Field of the Invention

The present invention generally relates to a buildup board structure, and more specifically to a buildup board structure incorporating magnetic induction coils and flexible boards, particularly, having modular buildup bodies to be easily laminated/stacked in an arbitrary order such that the magnetic induction coils embedded greatly enhance the overall effect of magnetic induction for the buildup board structure.

2. The Prior Arts

As well known, electrical products generally need rigid electric boards to accommodate electrical elements and provide electrical connection. One of the most commonly used rigid electric boards is the epoxy substrate because of its excellent property of electrical insulation. While the rigid electric board provides sufficient mechanical strength, it is substantially a planar plate and difficult to bend without damage to the internal electrical circuit. As a result, the rigid electric board is not suitable for the specific applications with very limited space like mobile phone and other portable electrical devices. Thus, the circuit board manufacturers have developed bendable or soft board with flexibility to meet the market requirements. Recently, the manufacturing skill and quality of the soft board have become well matured and stable.

Many circuits need coils to implement inductance such as magnetic induction coils. In traditional processes, metal copper or alloy is etched or electroplated to form spiral patterns serving as coils, and then through holes penetrating the spiral patterns are formed through chemical etching, mechanical or laser drilling.

Since the present coils and soft boards are manufactured by different manufacturers and well drilled to form the through holes, an additional process of attaching the coils to the soft boards is needed. However, the mismatch problem of the respective through holes of the coils to the soft boards often occurs during the attaching process. Such misalignment adversely affects overall electrical performance of the circuit board.

Therefore, it is greatly needed to provide a new buildup board structure having at least one first buildup body, at least one second buildup body and at least one third buildup body embedded with magnetic induction coils to be stacked in any order and by any number so as to provide addable effect of magnetic induction and greatly enhance overall magnetic induction, thereby overcoming the above problems in the prior arts.

SUMMARY OF THE INVENTION

The primary objective of the present invention is to provide a buildup board structure having at least one of first, second and third buildup units. The first buildup unit comprises at least one first buildup body, the second buildup unit comprises at least one second buildup body, and the third buildup unit comprises at least one third buildup body. In particular, the first buildup body is a double layers structure, the second buildup body is a three layers structure, and the third buildup body is a four layers structure. The first, second and third buildup bodies are stacked in any order. Each of the first, second and third buildup bodies is embedded with a plurality of magnetic induction coils for providing addable magnetic induction effect, respectively. In addition, each of the first, second and third buildup bodies is provided with a central hole, and a covering layer is employed to separate two adjacent ones of the first, second and third buildup bodies for insulation.

Specifically, the first buildup body comprises a first upper flexible board, a plurality of magnetic induction coils, a dielectric layer, a plurality of connection pads and a first lower flexible board, and the first upper flexible board, the dielectric layer and the first lower flexible board are sequentially stacked from top to bottom. The magnetic induction coils are embedded in the first upper flexible board or the first lower flexible board, wherein each magnetic induction coil embedded in the first upper flexible board is exposed to an upper surface of the first upper flexible board, and each magnetic induction coil embedded in the first lower flexible board is exposed to a lower surface of the first lower flexible board. Moreover, the connection pads are configured to penetrate the dielectric layer and electrically connect the magnetic induction coils embedded in the first upper flexible board and the magnetic induction coils embedded in the first lower flexible board, and the magnetic induction coils embedded in the first upper and lower flexible boards have a spiral shape, each configured in a horizontal plane.

Since the effect of magnetic induction provided by each magnetic induction coil is addable, overall magnetic induction of the first buildup body is enhanced.

Similar to the first buildup body, the second buildup body comprises a second upper flexible board, a second middle flexible board, a second lower flexible board, a plurality of magnetic induction coils, a dielectric layer and a plurality of connection pads, and particularly, the second upper flexible board, the dielectric layer, the second middle flexible board and the second lower flexible board are sequentially stacked from top to bottom. The magnetic induction coils are embedded in the second upper flexible board, the second middle flexible board or the second lower flexible board, wherein each magnetic induction coil embedded in the second upper flexible board is exposed to an upper surface of the second upper flexible board, each magnetic induction coil embedded in the second middle flexible board is exposed to a lower surface of the second middle flexible board, and each magnetic induction coil embedded in the second lower flexible board is exposed to a lower surface of the second lower flexible board.

Further, the magnetic induction coils in the second middle flexible board is not in contact with the magnetic induction coils in the second lower flexible board. The magnetic induction coils in the second upper flexible board are electrically connected to the magnetic induction coils in the second middle flexible board via the corresponding connection pads penetrating through the dielectric layer, and the magnetic induction coils in the second middle flexible board are further electrically connected to the magnetic induction coils in the second lower flexible board via the corresponding connection pads. Specifically, each of the magnetic induction coils embedded in the second upper, middle and lower flexible boards have a spiral shape, each configured in a horizontal plane.

As for the third buildup body, a third upper flexible board, a third intermediate flexible board, a third middle flexible board, a third lower flexible board, a plurality of magnetic induction coils, a first dielectric layer, a second dielectric layer and a plurality of connection pads are included. The third upper flexible board, the first dielectric layer, the third intermediate flexible board, the third middle flexible board, the second dielectric layer and the third lower flexible board are sequentially stacked from top to bottom. Further, the magnetic induction coils are embedded in the third upper flexible board, the third intermediate flexible board, the third middle flexible board or the third lower flexible board, wherein each magnetic induction coil embedded in the third upper flexible board is exposed to an upper surface of the third upper flexible board, each magnetic induction coil embedded in the third intermediate flexible board is exposed to a lower surface of the third intermediate flexible board, each magnetic induction coil embedded in the third middle flexible board is exposed to an upper surface of the third middle flexible board, and each magnetic induction coil embedded in the third lower flexible board is exposed to a lower surface of the third lower flexible board.

In particular, the magnetic induction coils in the third intermediate flexible board are not in contact with the magnetic induction coils in the third middle flexible board. Additionally, the magnetic induction coils in the third upper flexible board are electrically connected to the magnetic induction coils in the third intermediate flexible board via the corresponding connection pads penetrating through the first dielectric layer, the magnetic induction coils in the third upper and middle flexible boards are electrically connected via corresponding connection pads penetrating the first dielectric layer and the third intermediate flexible board, and the magnetic induction coils in the third middle flexible board are electrically connected to the magnetic induction coils in the third lower flexible board via the corresponding connection pads penetrating the second dielectric layer. Each of the magnetic induction coils embedded in the third upper, intermediate, middle and lower flexible boards have a spiral shape, each configured in a horizontal plane.

The above magnetic induction coils embedded in the first, second and third buildup bodies are configured around the corresponding central holes.

The first, second and third buildup bodies are modular and easily stacked together in any order to form the desired buildup structure with appropriate magnetic induction, and furthermore, the embedded magnetic induction coils are employed to effectively enhance overall magnetic induction, increase operational reliability and expand the application field.

BRIEF DESCRIPTION OF THE DRAWINGS

The present invention will be apparent to those skilled in the art by reading the following detailed description of a preferred embodiment thereof, with reference to the attached drawings, in which.

DETAILED DESCRIPTION OF THE PREFERRED EMBODIMENT

The accompanying drawings are included to provide a further understanding of the invention, and are incorporated in and constitute a part of this specification. The drawings illustrate embodiments of the invention and, together with the description, serve to explain the principles of the invention.

Figure 1:
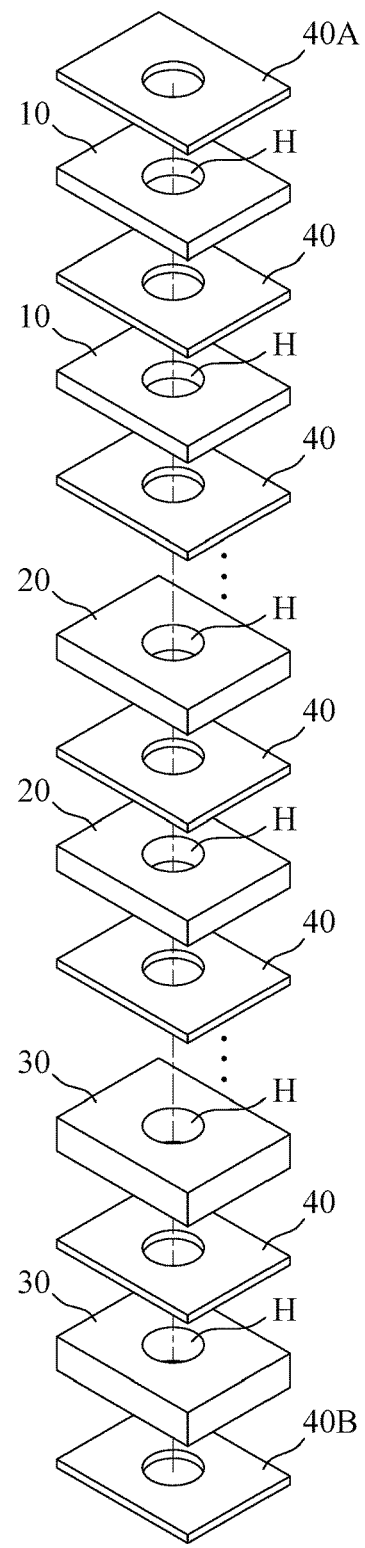
FIG. 1 is a perspective view showing the buildup board structure according to one embodiment of the present invention.
Figure 2:
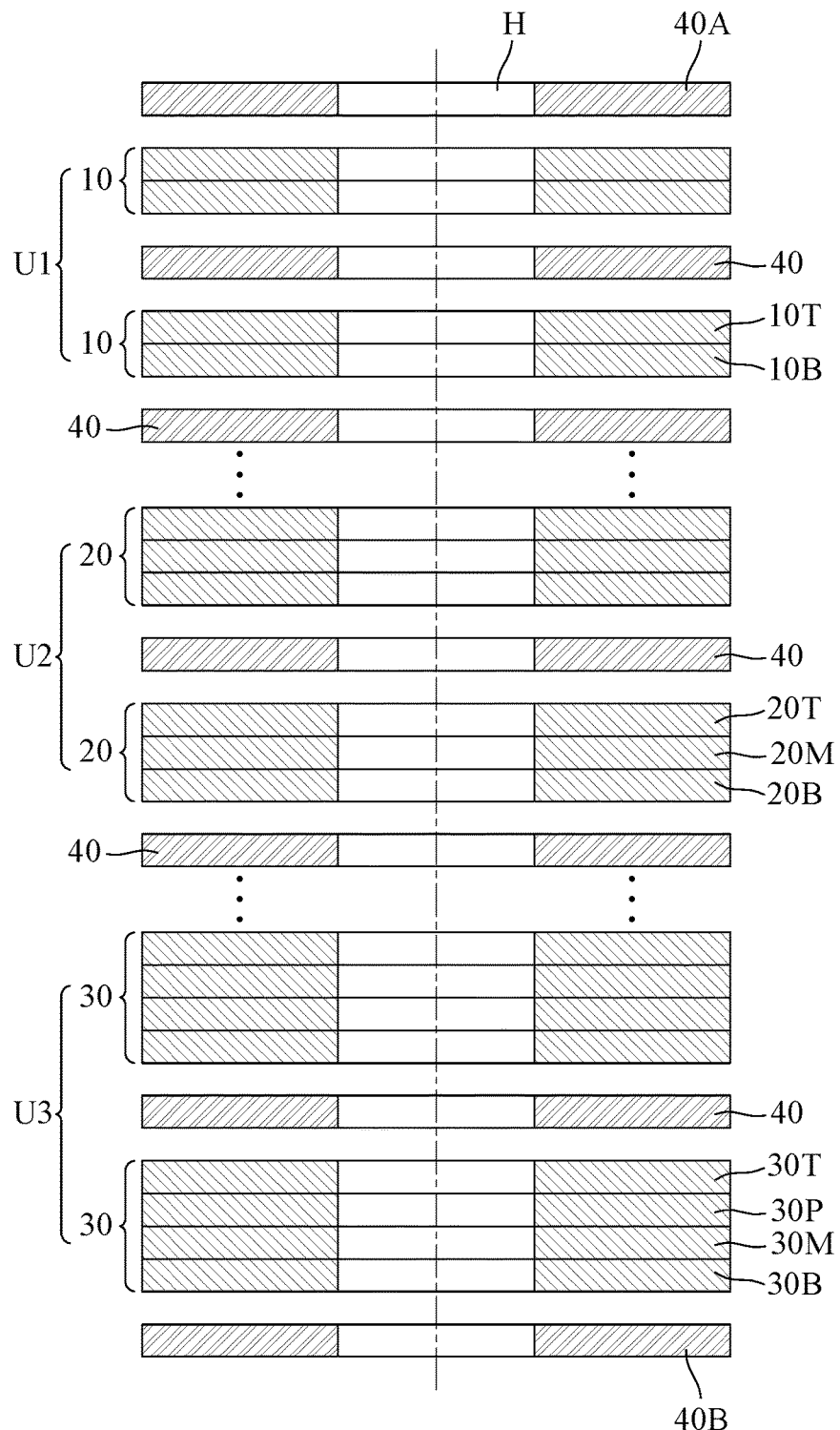
FIG. 2 is a cross sectional view showing the buildup board structure of the present invention.

Please refer to FIGS. 1 and 2, which illustrate a perspective view and a cross sectional view of the buildup board structure according to one embodiment of the present invention, respectively. As shown in FIGS. 1 and 2, the buildup board structure of the present invention generally comprises at least one of a first buildup unit U1, a second buildup unit U2 and a third buildup unit U3, wherein the first buildup unit U1 comprises at least one first buildup body 10, the second buildup unit U2 comprises at least one second buildup body 20, and the third buildup unit U3 comprises at least one third buildup body 30. Specifically, the first buildup body 10 is a double layers structure, the second buildup body 20 is a three layers structure, and the third buildup body 30 is a four layers structure. Any number of the first buildup body 10, the second buildup body 20 and the third buildup body 30 are included and stacked together in any order. Each of the first buildup body 10, the second buildup body 20 and the third buildup body 30 is provided with a central hole H, and the respective central holes H are configured to be aligned to one another. In addition, a covering layer 40 is inserted between any two adjacent buildup bodies such as the first buildup body 10, the second buildup body 20 and the third buildup body 30 for insulation.

It should be noted that FIGS. 1 and 2 are not intended to limit the scope of the present invention but only show an exemplary buildup board structure comprising two first buildup bodies 10, two second buildup bodies 20 and two third buildup bodies 30 stacked from top to bottom. In other words, any specific number of the first buildup body 10, the second buildup body 20 and the third buildup body 30 are included in the buildup board structure of the present invention and stacked in any order, wherein the any specific number is a positive integer. For example, the first buildup body 10 or the third buildup body 30 can be sandwiched between two other buildup bodies, and the buildup board structure may only comprise one or two buildup bodies including the first buildup bodies 10, the second buildup bodies 20 and/or the third buildup bodies 30.

Figure 3:
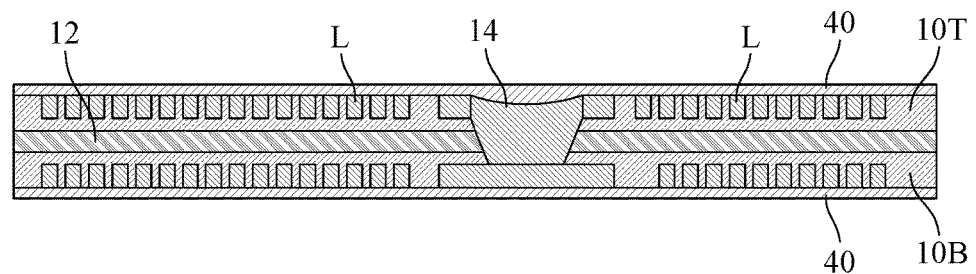
FIG. 3 is a detailed cross sectional view showing the first buildup body of the present invention.

With regard to the first buildup body 10, please refer to FIG. 3 showing a detailed cross sectional view. However, FIG. 3 just illustrates the left side of the first buildup body 10 with respect to the central hole H because the aspects of the right side is similar to those of the left side.

As shown in FIG. 3, the first buildup body 10 generally comprises a first upper flexible board 10T, a plurality of magnetic induction coils L, a dielectric layer 12, a plurality of connection pads 14 and a first lower flexible board 10B, and the first upper flexible board 10T, the dielectric layer 12 and the first lower flexible board 10B are sequentially stacked from top to bottom. The magnetic induction coils L are embedded in the first upper flexible board 10T or the first lower flexible board 10B. Specifically, each magnetic induction coil L embedded in the first upper flexible board 10T is exposed to an upper surface of the first upper flexible board 10T, and each magnetic induction coil L embedded in the first lower flexible board 10B is exposed to a lower surface of the first lower flexible board 10B. It should be noted that FIG. 3 only shows single one connection pad 14, which is exemplary and not intended to limit the scope of the present invention. Additionally, the connection pads 14 are configured to penetrate the dielectric layer 12 and electrically connect the magnetic induction coils L embedded in the first upper flexible board 10T and the magnetic induction coils embedded in the first lower flexible board 10B.

Moreover, the magnetic induction coils L embedded in the first upper and lower flexible boards 10T and 10B have a spiral shape, and each is configured in a horizontal plane.

The upper and/or lower surface of the first buildup body 10 is provided with the covering layer 40 for isolation and insulation to meet the actual needs. For instance, when the first buildup body 10 is configured between the second buildup body 20 is and the third buildup body 30, each of the upper and lower surfaces is covered by the covering layer 40 such that the first buildup body 10 is separated from the second buildup body 20 is and the third buildup body 30.

Figure 4:
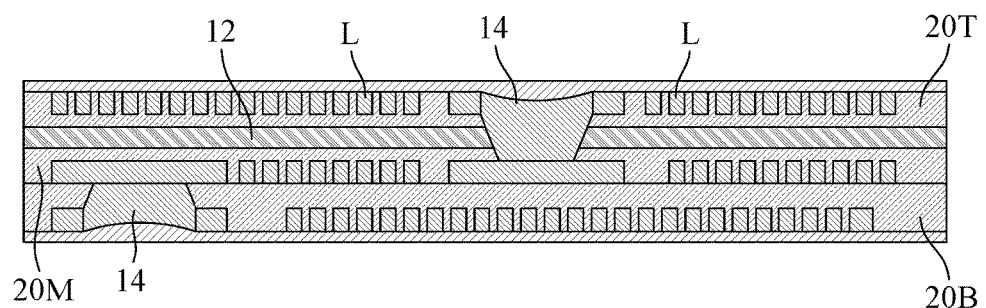
FIG. 4 is a detailed cross sectional view showing the second buildup body of the present invention.

Next, refer to FIG. 4. The second buildup body 20 shown in FIG. 4 is located at the left of the central hole H, and comprises a second upper flexible board 20T, a second middle flexible board 20M, a second lower flexible board 20B, a plurality of magnetic induction coils L, a dielectric layer 12 and a plurality of connection pads 14. Particularly, the second upper flexible board 20T, the dielectric layer 12, the second middle flexible board 20M and the second lower flexible board 20B are sequentially stacked from top to bottom. The magnetic induction coils L are embedded in the second upper flexible board 20T, the second middle flexible board 20M or the second lower flexible board 20B. Each magnetic induction coil L embedded in the second upper flexible board 20T is exposed to an upper surface of the second upper flexible board 20T, each magnetic induction coil L embedded in the second middle flexible board 20M is exposed to a lower surface of the second middle flexible board 20M, and each magnetic induction coil L embedded in the second lower flexible board 20B is exposed to a lower surface of the second lower flexible board 20B. More specifically, the magnetic induction coils L in the second middle flexible board 20M is not in contact with the magnetic induction coils L in the second bottom flexible board 20B.

Furthermore, the magnetic induction coils L in the second upper flexible board 20T are electrically connected to the magnetic induction coils L in the second middle flexible board 20M via the corresponding connection pads 14 penetrating through the dielectric layer 12, and the magnetic induction coils L in the second middle flexible board 20M are further electrically connected to the magnetic induction coils L in the second lower flexible board 20B via the corresponding connection pads 14.

Similar to the first buildup body 10 in FIG. 3, the magnetic induction coils L in the second upper flexible board 20T, the dielectric layer 12, the second middle flexible board 20M and the second lower flexible board 20B of the second buildup body 20 have a spiral shape, and each is configured in a horizontal plane.

Figure 5:
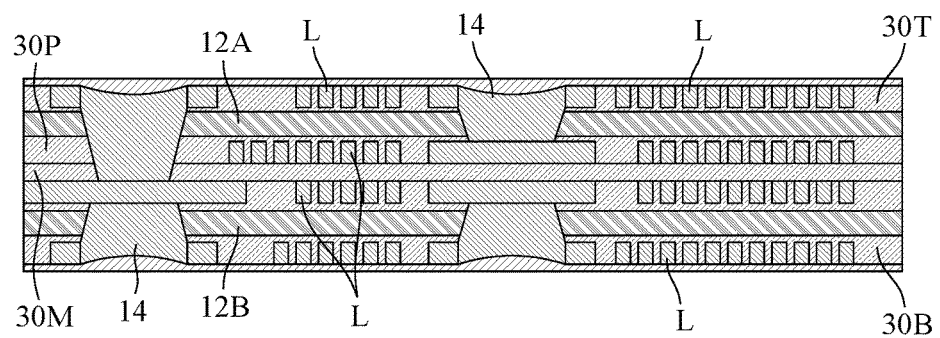
FIG. 5 is a detailed cross sectional view showing the third buildup body of the present invention.

Further refer to FIG. 5 only showing the left side of the third buildup body 30 with respect to the central hole H. The third buildup body 30 comprises a third upper flexible board 30T, a third intermediate flexible board 30P, a third middle flexible board 30M, a third lower flexible board 30B, a plurality of magnetic induction coils L, a first dielectric layer 12A, a second dielectric layer 12B and a plurality of connection pads 14, and the third upper flexible board 30T, the first dielectric layer 12A, the third intermediate flexible board 30P, the third middle flexible board 30M, the second dielectric layer 12B and the third lower flexible board 30B are sequentially stacked from top to bottom. Further, the magnetic induction coils L are embedded in the third upper flexible board 30T, the third intermediate flexible board 30P, the third middle flexible board 30M or the third lower flexible board 30B, wherein each magnetic induction coil L in the third upper flexible board 30T is exposed to an upper surface of the third upper flexible board 30T, each magnetic induction coil L in the third intermediate flexible board 30P is exposed to a lower surface of the third intermediate flexible board 30P, each magnetic induction coil L in the third middle flexible board 30M is exposed to an upper surface of the third middle flexible board 30M, and each magnetic induction coil L in the third lower flexible board 30B is exposed to a lower surface of the third lower flexible board 30B.

Particularly, the magnetic induction coils L in the third intermediate flexible board 30P are not in contact with the magnetic induction coils L in the third middle flexible board 30M. Additionally, the magnetic induction coils L in the third upper flexible board 30T are electrically connected to the magnetic induction coils L in the third intermediate flexible board 30P via the corresponding connection pads 14 penetrating through the first dielectric layer 12A, the magnetic induction coils L in the third upper and middle flexible boards 30T and 30M are electrically connected via corresponding connection pads 14 penetrating the first dielectric layer 12A and the third intermediate flexible board 30P, and the magnetic induction coils L in the third middle flexible board 30M are electrically connected to the magnetic induction coils L in the third lower flexible board 30B via the corresponding connection pads 14 penetrating the second dielectric layer 12B.

Similar to the second buildup body 20 in FIG. 4, the magnetic induction coils L embedded in the third upper, intermediate, middle and lower flexible boards 30T, 30P, 30M and 30B have a spiral shape and are configured in a horizontal plane.

More specifically, the magnetic induction coils L in the first, second and third buildup bodies 10, 20 and 30 are substantially configured around the corresponding central holes H to provide addable magnetic induction, and the buildup structure of the present invention provides sufficiently strong magnetic induction with simple architecture and high operational reliability.

It is preferred that the first, second and third buildup bodies 10, 20 and 30 have a cylindrical outline, and the central holes H of the first, second and third buildup bodies 10, 20 and 30 are circular through holes.

The above magnetic induction coils L and the connection pads 14 are formed of similar or different electrically conductive material, and the first upper flexible board 10T, the first lower flexible board 10B, the second upper flexible board 20T, the second middle flexible board 20M, the second lower flexible board 20B, the third upper flexible board 30T, the third intermediate flexible board 30P, the third middle flexible board 30M and the third lower flexible board 30B are formed of a flexible material with electrical insulation. Further, the dielectric layer 12, the first dielectric layer 12A and the second dielectric layer 12B are formed of a dielectric material, and the covering layer 40 is formed of a transparent or non-transparent material with electrical insulation.

Moreover, two additional covering layers 40A and 40B are further included in the present invention to cover an upper and lower surfaces of the buildup board structure, respectively, to implement insulation and protection such that the present invention is employed as an electrical element with magnetic induction, and easily attached to other electrical elements like one magnetic induction element having a different shape to form a single integrated element, which is simplified and suitable for end products and further expands the application field.

From the above description, one of the key aspects of the present invention is that the magnetic induction coils embedded in various buildup bodies are employed to greatly enhance the overall effect of magnetic induction of buildup board structure. In particular, all the magnetic induction coils have a spiral shape and are configured in the horizontal planes, respectively, such that the magnetic induction generated by each magnetic induction coil is addable and employed to increase sensitivity of magnetic induction.

In addition, Another aspect of the present invention is that each of the first, second and third buildup bodies is a separate and discrete body, and any number of the first, second and third buildup bodies is adjustable to meet the desired strength of magnetic induction of the whole buildup board structure. As a result, the present invention is easy to implement and possesses more industrial utility.

Although the present invention has been described with reference to the preferred embodiments thereof, it is apparent to those skilled in the art that a variety of modifications and changes may be made without departing from the scope of the present invention which is intended to be defined by the appended claims.

What is claimed is:

1. A buildup board structure, comprising at least one third buildup unit, the third buildup unit comprising at least one third buildup body, wherein the third buildup body is provided with a central hole and comprises a third upper flexible board, a third intermediate flexible board, a third middle flexible board, a third lower flexible board, a plurality of magnetic induction coils, a first dielectric layer, a second dielectric layer and a plurality of connection pads, the third upper flexible board, the first dielectric layer, the third intermediate flexible board, the third middle flexible board, the second dielectric layer and the third lower flexible board are sequentially stacked from top to bottom, the magnetic induction coils are embedded in the third upper flexible board, the third intermediate flexible board, the third middle flexible board or the third lower flexible board, each magnetic induction coil embedded in the third upper flexible board is exposed to an upper surface of the third upper flexible board, each magnetic induction coil embedded in the third intermediate flexible board is exposed to a lower surface of the third intermediate flexible board, each magnetic induction coil embedded in the third middle flexible board is exposed to an upper surface of the third middle flexible board, each magnetic induction coil embedded in the third lower flexible board is exposed to a lower surface of the third lower flexible board, the magnetic induction coils in the third intermediate flexible board are not in contact with the magnetic induction coils in the third middle flexible board, the magnetic induction coils in the third upper flexible board are electrically connected to the magnetic induction coils in the third intermediate flexible board via the corresponding connection pads penetrating through the first dielectric layer, the magnetic induction coils in the third upper and middle flexible boards are electrically connected via corresponding connection pads penetrating the first dielectric layer and the third intermediate flexible board, the magnetic induction coils in the third middle flexible board are electrically connected to the magnetic induction coils in the third lower flexible board via the corresponding connection pads penetrating the second dielectric layer, and each of the magnetic induction coils embedded in the third upper, intermediate, middle and lower flexible boards has a spiral shape and is configured in a horizontal plane.

2. The buildup board structure as claimed in claim 1, further comprising at least one first buildup unit, the first buildup unit comprising at least one first buildup body, wherein the first buildup body is provided with a central hole and comprises a first upper flexible board, a plurality of magnetic induction coils, a dielectric layer, a plurality of connection pads and a first lower flexible board, the first upper flexible board, the dielectric layer and the first lower flexible board are sequentially stacked from top to bottom, the magnetic induction coils are embedded in the first upper flexible board or the first lower flexible board, each magnetic induction coil embedded in the first upper flexible board is exposed to an upper surface of the first upper flexible board, each magnetic induction coil embedded in the first lower flexible board is exposed to a lower surface of the first lower flexible board, the connection pads are configured to penetrate the dielectric layer and electrically connect the magnetic induction coils embedded in the first upper flexible board and the magnetic induction coils embedded in the first lower flexible board, and each of the magnetic induction coils embedded in the first upper and lower flexible boards has a spiral shape and is configured in a horizontal plane.

3. The buildup board structure as claimed in claim 2, further comprising at least one second buildup unit, the second buildup unit comprising at least one second buildup body, wherein the second buildup body is provided with a central hole and comprises a second upper flexible board, a second middle flexible board, a second lower flexible board, a plurality of magnetic induction coils, a dielectric layer and a plurality of connection pads, the second upper flexible board, the dielectric layer, the second middle flexible board, the second lower flexible board are sequentially stacked from top to bottom, the magnetic induction coils are embedded in the second upper flexible board, the second middle flexible board or the second lower flexible board, each magnetic induction coil embedded in the second upper flexible board is exposed to an upper surface of the second upper flexible board, each magnetic induction coil embedded in the second middle flexible board is exposed to a lower surface of the second middle flexible board, the magnetic induction coils in the second lower flexible board is exposed to a lower surface of the second lower flexible board and not in contact with the magnetic induction coils in the second middle flexible board, the magnetic induction coils in the second upper flexible board are electrically connected to the magnetic induction coils in the second middle flexible board via the corresponding connection pads penetrating through the dielectric layer, the magnetic induction coils in the second middle flexible board are further electrically connected to the magnetic induction coils in the second lower flexible board via the corresponding connection pads, and each of the magnetic induction coils embedded in the second upper, middle and lower flexible boards has a spiral shape and is configured in to a horizontal plane.

4. The buildup board structure as claimed in claim 3, wherein the central holes of the first, second and third buildup bodies are configured to be aligned, the magnetic induction coils embedded in the first, second and third buildup bodies are configured around the corresponding central holes, the first, second and third buildup bodies are stacked in an arbitrary order, and each of the first buildup bodies, each of the second buildup bodies and each of the third buildup bodies are separated by a corresponding covering layer with electrical insulation.

5. The buildup board structure as claimed in claim 4, wherein the magnetic induction coils and the connection pads are formed of similar or different electrically conductive material.

6. The buildup board structure as claimed in claim 4, wherein the first upper flexible board, the first lower flexible board, the second upper flexible board, the second middle flexible board, the second lower flexible board, the third upper flexible board, the third intermediate flexible board, the third middle flexible board and the third lower flexible board are formed of a flexible material with electrical insulation.

7. The buildup board structure as claimed in claim 6, wherein the covering layer is formed of a transparent or non-transparent material with electrical insulation.

8. The buildup board structure as claimed in claim 6, wherein the central hole is a circular through hole, and each of the first, second and third buildup bodies has a cylindrical outline.

9. The buildup board structure as claimed in claim 4, wherein the dielectric layer, the first dielectric layer and the second dielectric layer are formed of a dielectric material.

10. The buildup board structure as claimed in claim 4, further comprising two additional covering layers covering an upper and lower surfaces of the buildup board structure, respectively.

\* \* \* \* \*